US010693482B2

(12) United States Patent
Caffee (10) Patent No.: US 10,693,482 B2
(45) Date of Patent: Jun. 23, 2020

(54) TIME-TO-VOLTAGE CONVERTER WITH EXTENDED OUTPUT RANGE

(71) Applicant: Silicon Laboratories Inc., Austin, TX (US)

(72) Inventor: Aaron J. Caffee, Scappoose, OR (US)

(73) Assignee: Silicon Laboratories Inc., Austin, TX (US)

(*) Notice: Subject to any disclaimer, the term of this patent is extended or adjusted under 35 U.S.C. 154(b) by 68 days.

(21) Appl. No.: 16/020,605

(22) Filed: Jun. 27, 2018

(65) Prior Publication Data

US 2020/0007138 A1   Jan. 2, 2020

(51) Int. Cl.
| G04F 10/00 | (2006.01) |
| H03M 1/06 | (2006.01) |
| H03K 5/156 | (2006.01) |
| H03M 1/50 | (2006.01) |

(52) U.S. Cl.
CPC ........ *H03M 1/0604* (2013.01); *G04F 10/005* (2013.01); *H03K 5/1565* (2013.01); *H03M 1/502* (2013.01)

(58) Field of Classification Search
CPC .. H03M 1/0604; H03M 1/502; H03M 1/0607; H03M 1/0612; H03M 1/82; H03K 5/1565; G04F 10/005
See application file for complete search history.

(56) References Cited

U.S. PATENT DOCUMENTS

| 3,676,661 A | 7/1972 | Sprowl |
| 4,584,489 A | 4/1986 | Tanaka |
| 5,659,314 A * | 8/1997 | Tokura ................. H03M 3/43 341/143 |
| 7,417,510 B2 | 8/2008 | Huang |
| 8,283,933 B2 | 10/2012 | Dasnurkar |
| 8,462,840 B2 | 6/2013 | Chen |
| 8,503,597 B2 | 8/2013 | Fischette |
| 8,531,246 B2 | 9/2013 | Huang |
| 8,669,810 B2 | 3/2014 | Kwon |
| 8,692,599 B2 | 4/2014 | Gong et al. |

(Continued)

OTHER PUBLICATIONS

Alahdab, S. et al., "A 12-Bit Digital-to-Time Converter (DTC) with sub-ps-level resolution using current DAC and differential switch for Time-to-Digital Converter (TDC)," IEEE International Instrumentation and Measurement Technology Conference (I2MTC), May 13-16, 2012, pp. 2668-2671.

(Continued)

*Primary Examiner* — Jung Kim
(74) *Attorney, Agent, or Firm* — Zagorin Cave LLP (57) ABSTRACT

A time-to-voltage converter includes a switched-capacitor circuit configured to charge an output node to a reset voltage level in a first interval of a conversion period and configured to shift a voltage on the output node from the reset voltage level to a shifted reset voltage level in a second interval of the conversion period. The time-to-voltage converter includes a current source selectively coupled to the output node. The current source is configured to provide a constant current to the output node in a third interval of the conversion period. The shifted reset voltage level is outside a voltage range defined by a first power supply voltage level on a first voltage reference node and a second power supply voltage level on a second voltage reference node.

20 Claims, 7 Drawing Sheets

(56) References Cited

U.S. PATENT DOCUMENTS

| | | |
|---|---|---|
| 8,736,476 B2 | 5/2014 | Gong et al. |
| 8,994,573 B2 | 3/2015 | Henzler |
| 9,007,251 B2 | 4/2015 | Perthold |
| 9,071,304 B2 | 6/2015 | Banin |
| 9,137,084 B2 | 9/2015 | Degani |
| 9,209,958 B1 | 12/2015 | Palaskas |
| 9,362,936 B1 | 6/2016 | Caffee et al. |
| 9,379,879 B1 | 6/2016 | Caffee et al. |
| 9,531,394 B1 | 12/2016 | Caffee et al. |
| 2004/0174286 A1 | 9/2004 | Donovan |
| 2011/0156783 A1 | 6/2011 | Pavlovic |
| 2014/0002288 A1 | 1/2014 | Scholz |
| 2014/0176201 A1 | 6/2014 | Weltin-Wu |
| 2015/0145567 A1 | 5/2015 | Perrott |
| 2015/0145569 A1 | 5/2015 | Perrott |
| 2015/0145570 A1 | 5/2015 | Perrott |
| 2015/0145571 A1 | 5/2015 | Perrott |

OTHER PUBLICATIONS

Enz, C. and Temes, G., "Circuit Techniques for Reducing the Effects of Op-Amp Imperfections: Autozeroing, Correlated Double Sampling, and Chopper Stabilization," Proceedings of the IEEE, vol. 84, No. 11, Nov. 1996, pp. 1584-1614.

Liu, H., et al., "A 0.98mW Fractional-N ADPLL Using 10b Isolated Constant-Slope DTC with FOM of -246dB for IoT Applications in 65nm CMOS," ISSCC 2018, Session 15, RF PLLs/15.1, 2018, pp. 246-248.

Ru, J., et al., "A High-Linearity Digital-to-Time Converter Technique: Constant-Slope Charging," IEEE Journal of Solid-State Circuits, vol. 50, No. 6, Jun. 2015, pp. 1412-1423.

\* cited by examiner

TIME-TO-VOLTAGE CONVERTER WITH EXTENDED OUTPUT RANGE

BACKGROUND

Field of the Invention

This application is related to signal converters and more particularly to time-to-voltage converters.

Description of the Related Art

Integrated circuit applications use time-to-voltage converters in time-to-digital converters and digital-to-time converters. A typical time-to-voltage converter charges a capacitor during an interval of interest to generate an output voltage proportional to the interval. That output voltage may be measured using an analog-to-digital converter of a time-to-digital converter or may be compared to a predetermined threshold voltage by a comparator of a digital-to-time converter.

Figure 1:
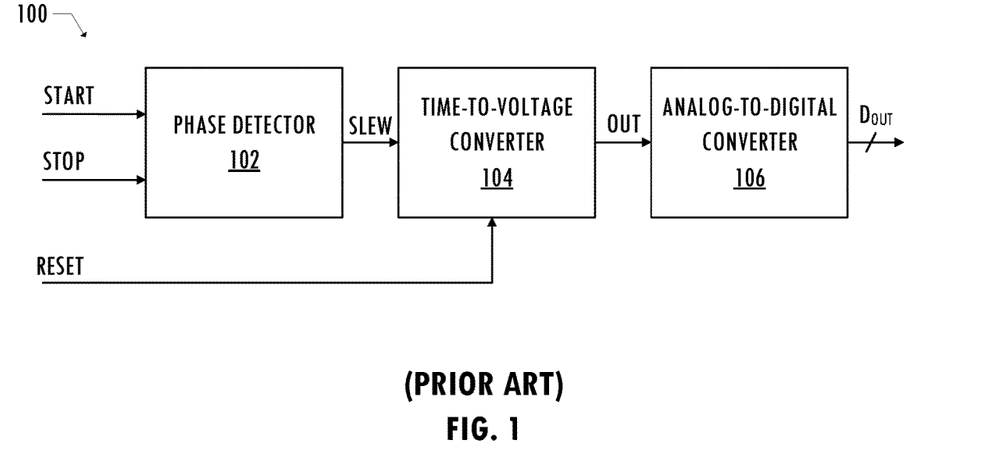
FIG. 1 illustrates a functional block diagram of a conventional time-to-digital converter.
Figure 2:
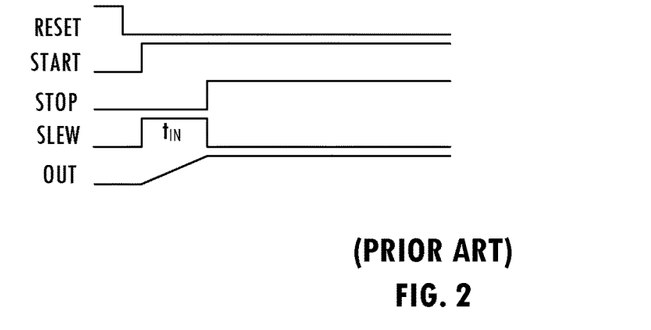
FIG. 2 illustrates timing waveforms for a time-to-digital conversion period of the conventional time-to-digital converter of FIG. 1.
Figure 3:
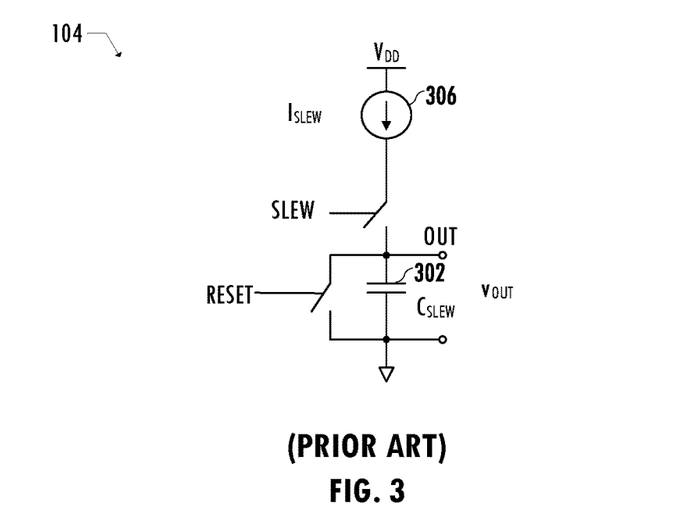
FIG. 3 illustrates a circuit diagram of an exemplary time-to-voltage converter configured for use in the time-to-digital converter of FIG. 1.

Referring to FIGS. 1-3, time-to-digital converter 100 includes phase detector 102, which generates signal SLEW that represents the interval between a start event (e.g., a rising edge of signal START) and a stop event (e.g., a rising edge of signal STOP). Time-to-voltage converter 104 charges capacitor 302 during the interval being measured (e.g., input interval tin of signal SLEW, which represents the phase difference between signal START and signal STOP). Initially, signal SLEW and signal RESET configure time-to-voltage converter 104 in a reset interval (e.g., RESET=='1' and SLEW=='0') during which capacitor 302 discharges to a reset voltage (e.g., 0 V). A start event (e.g., a rising edge of signal SLEW) causes time-to-voltage converter 104 to enter a charging interval. During the charging interval (e.g., RESET=='0' and SLEW=='1'), time-to-voltage converter 104 charges capacitor 302 using current source 306, which provides constant current $I_{SLEW}$ to capacitor 302, causing voltage $v_{OUT}$ to increase with time. At the end of the charging interval, a stop event (e.g., a falling edge of signal SLEW) causes time-to-voltage converter 104 to enter a hold interval and to disconnect capacitor 302 from current source 306, which stops the charging of capacitor 302. The time-to-digital conversion includes the reset interval, charging interval, and hold interval, and typically repeats the time-to-voltage conversion periodically in response to signal START, signal STOP, and signal RESET being periodic. Time-to-voltage converter 104 provides voltage $v_{OUT}$ to analog-to-digital converter 106, which is a conventional voltage-mode analog-to-digital converter that generates digital output code $D_{OUT}$ based on output voltage $v_{OUT}$ received from time-to-voltage converter 104.

Figure 4:
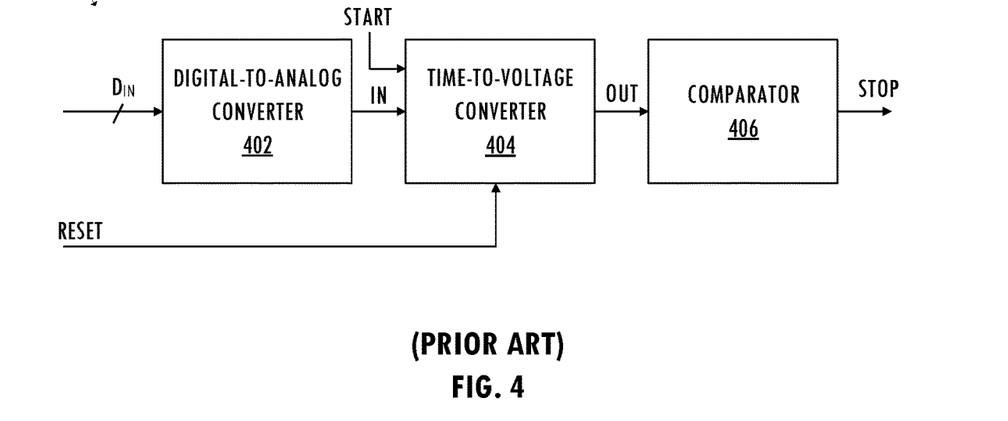
FIG. 4 illustrates a functional block diagram of a conventional digital-to-time converter.
Figure 5:
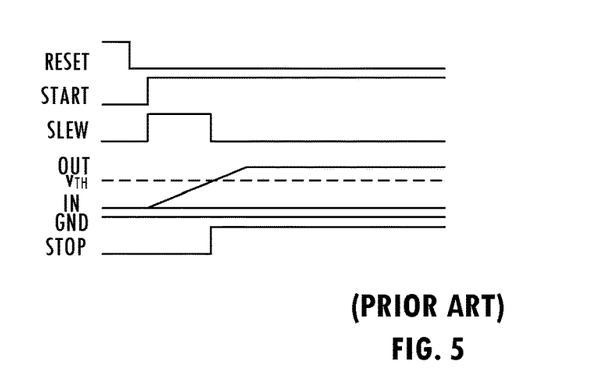
FIG. 5 illustrates timing waveforms for a digital-to-time conversion period of the conventional digital-to-time converter of FIG. 4.
Figure 6:
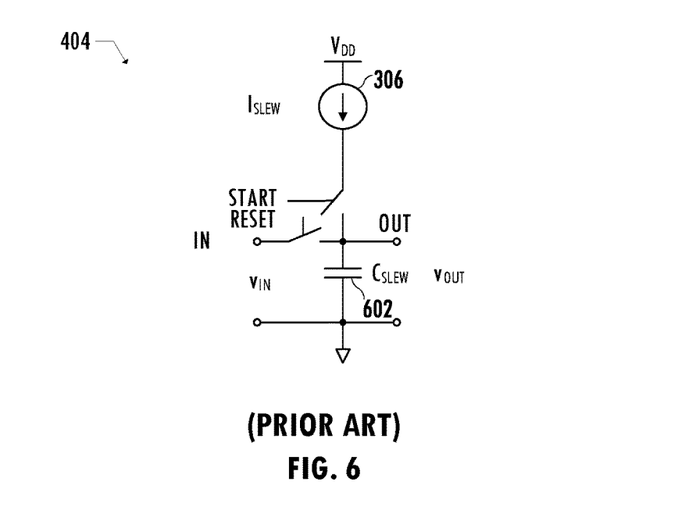
FIG. 6 illustrates a circuit diagram of an exemplary time-to-voltage converter configured for use in the digital-to-time converter of FIG. 4.

Referring to FIGS. 4-6, digital-to-time converter 400 generates signal STOP having an event that is delayed with respect to an event of signal START by a programmable amount using input digital code $D_{IN}$. Digital-to-analog converter 402 generates signal IN having a voltage level that corresponds to input digital code $D_{IN}$. Time-to-voltage converter 404 uses the voltage level of signal IN provided by digital-to-analog converter 402 as an initial capacitor voltage level for capacitor 602. Time-to-voltage converter 404 charges capacitor 602 to the voltage level indicated by input voltage $v_{IN}$ during a reset interval (e.g., signal RESET=='1' and signal START=='0'). A start event (e.g., a rising edge of signal START) causes time-to-voltage converter 404 to enter a charging interval (e.g., RESET=='0' and SLEW=='1') to charge capacitor 602 using current source 306, which provides constant current $I_{SLEW}$ to cause voltage $v_{OUT}$ across capacitor 602 to increase with time from input voltage $v_{IN}$. Time-to-voltage converter 404 provides voltage $v_{OUT}$ to comparator 406, which is a conventional comparator circuit. Comparator 406 detects when voltage $v_{OUT}$ crosses a threshold voltage level and generates a transition (e.g., a rising edge) of signal STOP. The delay between the rising edge of signal START and a corresponding rising edge of signal STOP is, under ideal conditions, linearly related to the level of input digital code $D_{IN}$. The digital-to-time conversion includes the reset interval, charging interval, and hold interval, and typically repeats periodically in response to signal START, signal STOP, and signal RESET being periodic.

Referring to FIG. 3 time-to-voltage converter 104 resets the output voltage $v_{OUT}$ to reset voltage $v_{RESET}$, which is typically a ground voltage to provide a maximum available voltage to current source 306. Referring to FIG. 6, time-to-voltage converter 404 resets the output voltage $v_{OUT}$ to reset voltage $v_{IN}$ received from digital-to-analog converter 402. Reset voltage $v_{RESET}$ is less than threshold voltage $v_{TH}$ of comparator 406 (e.g., threshold voltage $v_{TH}$ of 0.6 V for $V_{DD}$ of 1.2 V) and is greater than a ground voltage. Reset voltage $v_{RESET}$ provides a maximum available voltage to current source 306.

In general, as power supply voltage levels decrease, the available voltage decreases and overdrive voltages (i.e., the gate-to-source voltage in excess of the threshold voltage of the transistors in the current source) decrease for current source devices, thus increasing thermal noise. In addition, decreases in available voltage decrease output impedance of the time-to-voltage converter, which decreases linearity of the time-to-voltage converter output. Incorporation of time-to-voltage converter 104 in time-to-digital converter 100 of FIG. 1 requires support of a time delay range, which reduces available voltage. Similarly, referring to FIG. 4, incorporation of time-to-voltage converter 404 in digital-to-time converter 400 requires support of a time interval range, which also reduces available voltage. Comparator 406 is responsive to the output of time-to-voltage converter 404 and has a delay that is dependent on the slew rate of the input signal, thus requiring additional voltage margin to ensure near-constant slew rate operation, i.e., linear delay as a function of digital input code. Conventional time-to-digital converters support only a non-zero minimum time interval to ensure linear operation (e.g., to ensure charging of the capacitor in a linear time interval during which associated switches have inverted channels that conduct), thus increasing the voltage requirement. To operate over a predetermined range and offset with limited voltage, slower slew rates may be used. However, slower slew rates increase random jitter. Operation at higher slew rates causes nonlinearity in the output signal, which increases deterministic jitter. To simultaneously improve random jitter and deterministic jitter, a time-to-voltage converter with increased output voltage range is desired.

SUMMARY OF EMBODIMENTS OF THE INVENTION

In at least one embodiment of the invention, an apparatus includes a first voltage reference node, a second voltage reference node, and a time-to-voltage converter. The time-to-voltage converter includes a switched-capacitor circuit configured to charge an output node to a reset voltage level in a first interval of a conversion period and configured to shift a voltage on the output node from the reset voltage level to a shifted reset voltage level in a second interval of the conversion period. The shifted reset voltage level is outside a voltage range of the voltage on the output node defined by a first power supply voltage level on the first voltage reference node and a second power supply voltage level on the second voltage reference node. The apparatus may include a first transistor having a first conductivity type and being coupled to the output node. The first transistor may be configured as an open switch in the first interval and the second interval. The switched-capacitor circuit may include a second transistor having the first conductivity type and being coupled between the output node and the second voltage reference node. The second transistor may be configured as an open switch in the second interval and a third interval of the conversion period. The switched-capacitor circuit may include a level shifting circuit configured to provide a level-shifted control signal to a gate terminal of the second transistor. The level-shifted control signal may have a level-shifted voltage level outside the voltage range.

In at least one embodiment of the invention, a method for converting a time signal to a voltage signal includes storing charge on a capacitor of the time-to-voltage converter to provide a reset voltage level on an output node of the time-to-voltage converter in a first interval of a time-to-voltage conversion. The method includes shifting a voltage level of the output node from the reset voltage level to a shifted reset voltage level in a second interval of the time-to-voltage conversion. The shifted reset voltage level is outside a voltage range of an output signal of the time-to-voltage converter defined by a first power supply voltage level on a first voltage reference node and a second power supply voltage level on a second voltage reference node. The method may include charging the capacitor to an output voltage level using a constant current during a third interval of the time-to-voltage conversion. The charging may include providing the constant current using a current source selectively coupled to the capacitor. The constant current may flow from the current source to the capacitor and the shifted reset voltage level may be less than the second power supply voltage level. The charging may include providing the constant current using a current source selectively coupled to the capacitor. The constant current may flow from the capacitor to the current source and the shifted reset voltage level may be greater than the first power supply voltage level.

In at least one embodiment of the invention, a time-to-voltage converter includes a current source selectively coupled to an output node. The current source includes a first transistor having a first conductivity type coupled to the output node. The time-to-voltage converter includes a switched-capacitor circuit. The switched-capacitor circuit includes a capacitor coupled between a first node and the output node. The switched-capacitor circuit includes a second transistor having the first conductivity type. The second transistor is coupled to the first node. The switched-capacitor circuit includes a third transistor having the first conductivity type and being coupled to the output node. The second transistor and the third transistor are configured to charge the output node to a reset voltage in a first interval of a conversion period and are configured as open circuits in a second interval of the conversion period and in a third interval of the conversion period.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 7:
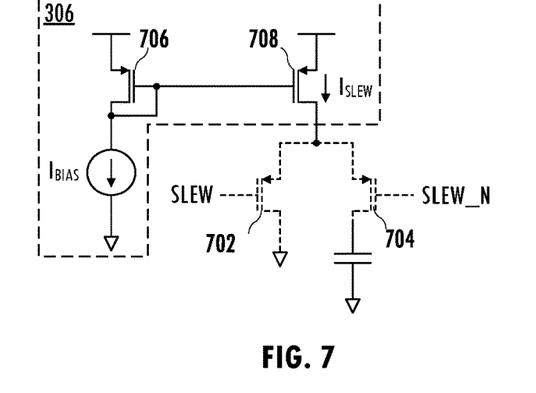
FIG. 7 illustrates a transistor implementation of switches in the exemplary time-to-voltage converter of the time-to-digital converter of FIG. 1 and the digital-to-time converter of FIG. 4.

Referring to FIG. 7, in general, performance of the time-to-voltage converter depends on the performance of current source 306. Noise of current source 306 can dominate the noise of the time-to-voltage converter. Increases to the current source overdrive voltage for transistor 706 and transistor 708 reduces current source noise. Linearity of the time-to-voltage converter improves with increased voltage allocated to current source 306, which increases the output impedance of the time-to-voltage converter. Cascoding (not shown) further improves the output impedance of the time-to-voltage converter, increases voltage allocated to the current source, and reduces the output voltage range. The reduced output voltage range increases analog-to digital converter noise of time-to-digital converter 100 of FIG. 1 and increases the contribution of comparator 406 to noise in digital-to-time converter 400 of FIG. 4.

Referring to FIG. 7, slewing transistor 702 and slewing transistor 704 typically contribute non-dominant noise to the time-to-voltage converter. Increases to the overdrive voltages of slewing transistor 702 and slewing transistor 704 improve linearity by reducing turn-on time and turn-off time and by reducing charge injection and clock feedthrough. However, the increased switch overdrive voltage reduces the voltage available to current source 306.

Referring to FIGS. 1 and 4, noise performance of time-to-digital converter 100 and digital-to-time converter 400 may be limited by noise performance of time-to-voltage converter 104 and time-to-voltage converter 404, respectively. Noise of time-to-voltage converter 104 and time-to-voltage converter 404 reduces with increased voltage. In addition, linearity of time-to-voltage converter 104 and time-to-voltage converter 404 increases with increased voltage. Available voltage may be increased by reducing the voltage allocated to on-chip regulators so that more may be allocated to the current source. However, reducing the voltage allocated to on-chip regulators increases supply sensitivity and, therefore, degrade spur and/or supply rejection performance. Furthermore, increasing the voltage across the current source beyond the rated voltage of the current source may reduce reliability.

A technique for improving linearity of a time-to-voltage converter and reducing noise of the time-to-voltage converter increases the available voltage of the time-to-voltage converter using a capacitive level-shift. The capacitive level-shift resets the output voltage of the time-to-voltage converter to reset voltage level $v_{RESET}$ (i.e., $v_{RESET} > V_{DD}$ or $v_{RESET} < 0V$) that exceeds the power supply voltage range (i.e., $0 \leq v \leq V_{DD}$). The increase in voltage increases the slew rate that can be supported at the output of the time-to-voltage converter, which improves linearity and noise performance as compared to the conventional time-to-voltage converters of FIG. 3 and FIG. 6.

Figure 8:
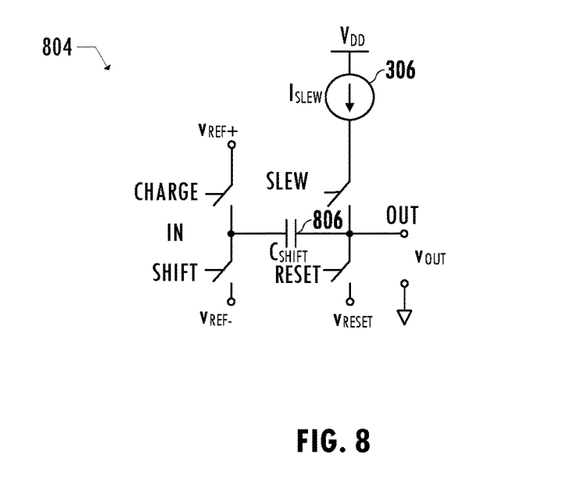
FIG. 8 illustrates a circuit diagram of an exemplary level-shifting time-to-voltage converter configured for a time-to-digital converter application consistent with at least one embodiment of the invention.
Figure 9:
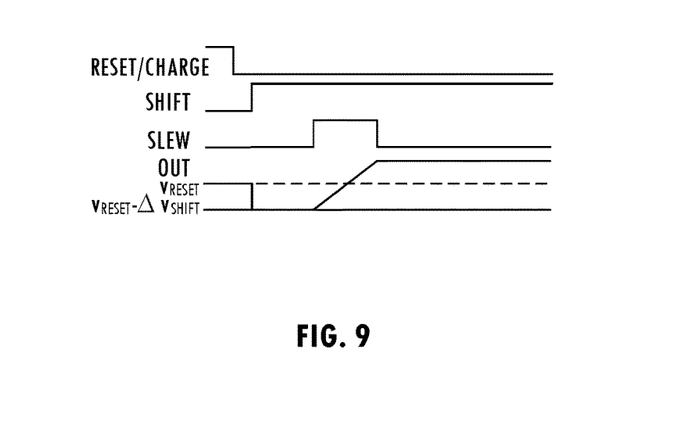
FIG. 9 illustrates timing waveforms for a time-to-voltage conversion period of the level-shifting time-to-voltage converter of FIG. 8.

Referring to FIGS. 8 and 9, level-shifting time-to-voltage converter 804 includes level-shifting capacitor 806 that is used to increase the voltage range of a time-to-voltage converter to exceed the power supply voltage range by at least $V_T$ where $V_T$ is a threshold voltage of a transistor in the switched-capacitor circuit of the time-to-voltage converter 804. In at least one embodiment, the voltage range of a time-to-voltage converter is twice power supply voltage $V_{DD}$ (e.g., $-V_{DD} < v_{OUT} < V_{DD}$). In embodiments of a digital-to-time converter that use first power supply $V_{DD1}$ for level-shifting time-to-voltage converter 804 and second power supply $V_{DD2}$ for the digital-to-analog converter, the extended voltage range of a level-shifting time-to-voltage converter is $V_{DD1} + V_{DD2}$ (e.g., $-V_{DD1} < v_{OUT} < V_{DD2}$).

Level-shifting time-to-voltage converter 804 resets the output node and pre-charges level-shifting capacitor 806 to develop reset voltage $v_{RESET}$ on the output node. Although FIGS. 8 and 9 illustrate the resetting and pre-charging of the output node as occurring in response to the same control signal, independent control signals may be used and the resetting and pre-charging of the output node may occur independently and/or sequentially. After the resetting and pre-charging interval, level-shifting time-to-voltage converter 804 shifts the output voltage by shift voltage $\Delta v_{SHIFT}$ as follows:

$$\Delta v_{SHIFT} = (v_{REF+} + v_{REF-}) \times C_{SHIFT}/(C_{SHIFT} + C_{OUT}),$$

resulting in the voltage on the output node shifting from $v_{RESET}$ to $v_{RESET} - \Delta v_{SHIFT}$. In a slewing interval of the time-to-voltage conversion period, the output node may receive charge from current source 306, causing output voltage $v_{OUT}$ to increase from $v_{RESET} - \Delta v_{SHIFT}$. Although FIGS. 8 and 9 illustrate the shift and slew control signals as being different control signals, shifting, and slewing may be controlled using the same control signal.

Figure 10:
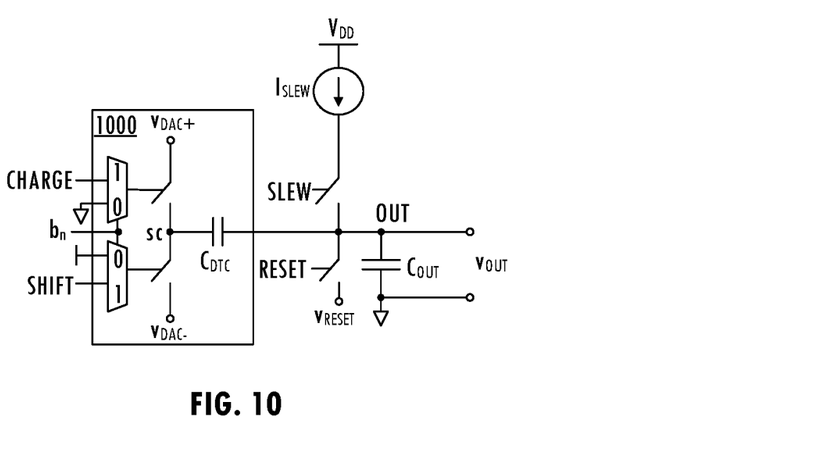
FIG. 10 illustrates a circuit diagram of an exemplary level-shifting time-to-voltage converter integrated with a capacitive digital-to-analog converter cell for a digital to-time converter consistent with at least one embodiment of the invention.
Figure 11:
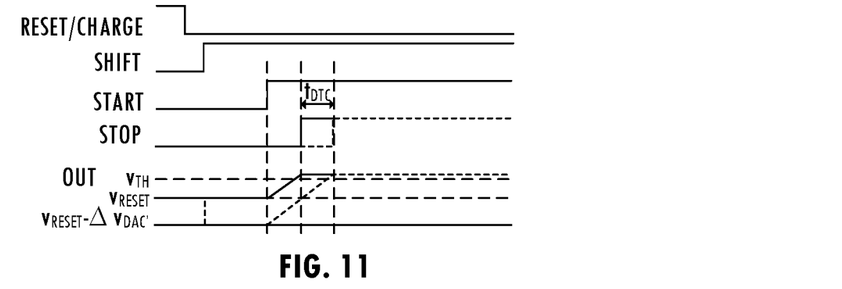
FIG. 11 illustrates timing waveforms for a time-to-voltage conversion period of the circuit of FIG. 10.

Level-shifting time-to-voltage converter 804 is configured for a time-to-digital converter application. However, level-shifting time-to-voltage converter 804 may be adapted for a digital-to-time application. Referring to FIGS. 4, 10, and 11, an embodiment of digital-to-time converter 400 includes digital-to-analog converter 402, which may include a capacitive digital-to-analog converter. In at least one embodiment of digital-to-time converter 400, level-shifting time-to-voltage converter 804 combines shift voltage $\Delta v_{SHIFT}$ with a voltage of the capacitive digital-to-analog converter and the associated charging operations may be combined as well. For example, a capacitive digital-to-analog converter combines the shift capacitance of the level-shifting time-to-voltage converter and the capacitor of a capacitive digital-to-analog converter circuit and the extended voltage range is combined with the digital-to-analog conversion. During the shifting interval, bit cell 1000 of the capacitive digital-to-analog converter shifts the output voltage below $v_{RESET}$ if the corresponding input bit is high (i.e., $b_n == '1'$) to generate an output time signal STOP having a delay of $t_{DTC}$, where $$t_{DTC} = C_{DTC} \times (v_{DAC+} - v_{DAC-})/I_{SLEW}.$$

Figure 12:
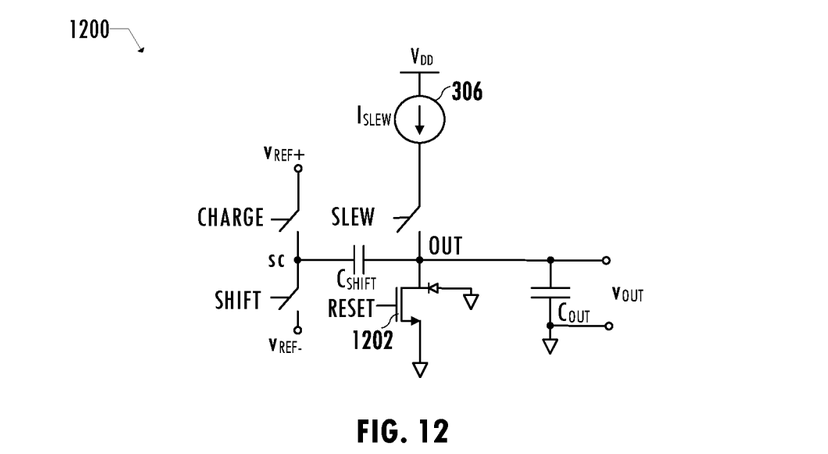
FIG. 12 illustrates a circuit diagram of an exemplary level-shifting time-to-voltage converter consistent with at least one embodiment of the invention.
Figure 13:
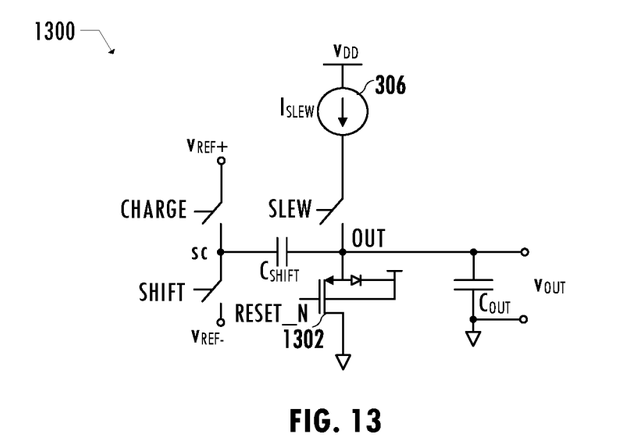
FIG. 13 illustrates a circuit diagram of an exemplary level-shifting time-to-voltage converter consistent with at least one embodiment of the invention.

Referring to FIG. 12, level-shifting time-to-voltage converter 1200 includes n-type transistor 1202 as reset switch coupled between the output node and a reset voltage node that is coupled to a ground node and the reset voltage $v_{RESET}$ is a ground voltage. Boosting the output voltage from a ground voltage to a voltage level below ground causes leakage of the drain diode of transistor 1202. To reduce or eliminate that leakage, rather than using n-type transistor 1202, the reset switch of level-shifting time-to-voltage converter 1300 of FIG. 13 includes p-type transistor 1302 responsive to a complementary reset signal, signal RESET_N. The reset switch and drain diode of level-shifting time-to-voltage converter 1300 of FIG. 13 has negligible leakage in response to output voltage $v_{OUT}$ being below ground. However, for proper operation, the voltage on the gate of p-type transistor 1302 should be less than a ground voltage level.

Figure 14:
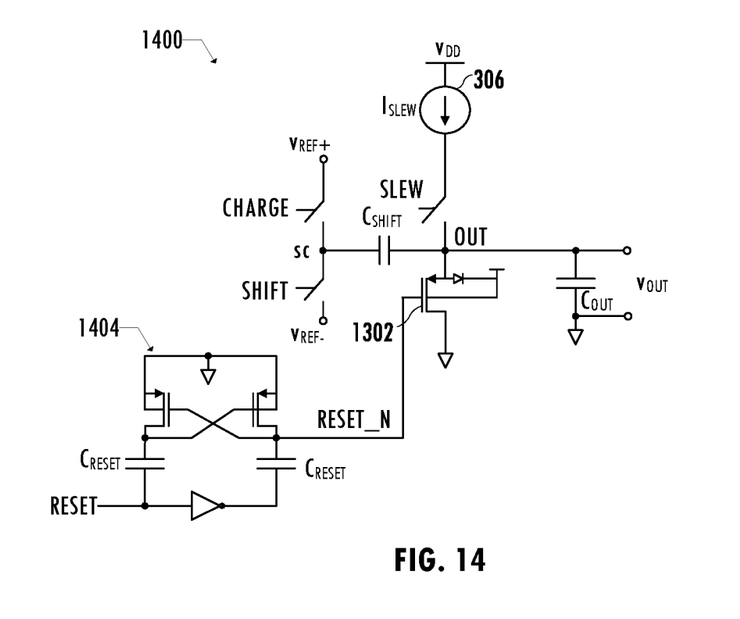
FIG. 14 illustrates a circuit diagram of an exemplary level-shifting time-to-voltage converter with level-shifting signal generation consistent with at least one embodiment of the invention.
Figure 15:
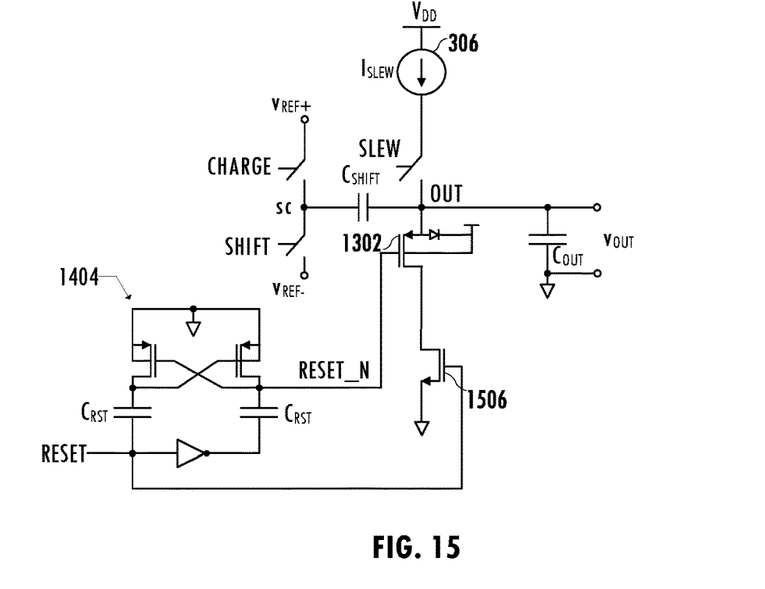
FIG. 15 illustrates a circuit diagram of an exemplary level-shifting time-to-voltage converter with level-shifting signal generation and increased output voltage range consistent with at least one embodiment of the invention.

Accordingly, referring to FIG. 14, level-shifting time-to-voltage converter 1400 includes level shifter 1404 that translates signal RESET from 0 V to $V_{DD}$ logic levels to $-V_{DD}$ to 0 V logic levels, respectively. However, in practice, the capacitor divider with $C_{RST}$ makes a logic low level of RESET_N to a voltage level that is greater than $-V_{DD}$. The reset switch that includes p-type transistor 1302 limits the maximum voltage on the output node. In a time-to-digital converter, the limited voltage on the output node limits the extended output voltage range. However, including n-type transistor 1506 in series with p-type transistor 1302 of FIG. 15 increases the output voltage range. This embodiment may reduce or eliminate p-type transistor 1506 from unnecessarily turning on at high output voltages, thus extending the output voltage range of the time-to-voltage converter at the high end of the output voltage range in time-to-digital converter applications.

Figure 16:
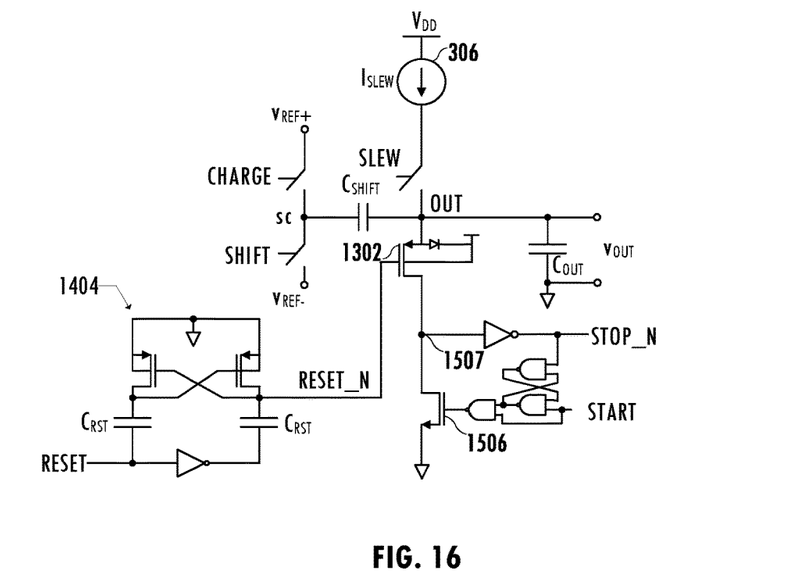
FIG. 16 illustrates a circuit diagram of an exemplary level-shifting time-to-voltage converter including a switch integrated with a comparator of a digital-to-time converter consistent with at least one embodiment of the invention.

Referring to FIGS. 4 and 16, digital-to-time converter 400 may exploit the limited maximum voltage on the output node by integrating p-type transistor 1302 into comparator 406 in a dynamic inverter that generates signal STOP_N. P-type transistor 1302 limits the maximum voltage level and is useful for shielding comparator 406 from voltages beyond the rating of comparator 406. The addition of n-type transistor 1506 controlled by a set-reset latch between p-type transistor 1302 and ground limits the output voltage and prevents the current source from operating in the triode region of operation, which could cause longer recovery times in between edges and unnecessarily reducing the speed of operation. In response to a low value of signal START and a high value of signal STOP_N turns on n-type transistor 1506, which discharges node 1507 to ground. In response to a high value of signal START and a high value of signal STOP_N, which occurs during slewing of node OUT, n-type transistor 1506 turns off allowing an edge to propagate through the dynamic inverter without contention. Signal STOP_N transitions low in response to comparator 406 detecting a transition of output voltage $v_{OUT}$ across threshold voltage $v_{TH}$. In response to a high value of signal START and a low value of signal STOP_N, signal STOP propagates through the signal path. The transition to a low signal level of signal STOP_N causes the set-reset latch to force n-type transistor 1506 to turn on after the edge propagates through the dynamic inverter preventing the level of output voltage $v_{OUT}$ from increasing, thus preventing the current source from entering the triode region of operation. A high value of signal START and a high value of signal STOP_N results from n-type transistor 1506 turning on and discharging node 1507. The loop delay sets the width of a negative pulse on signal STOP_N. A low value of signal START and a high value of signal STOP_N indicates the end of the slewing interval and ready for a next conversion period.

Figure 17:
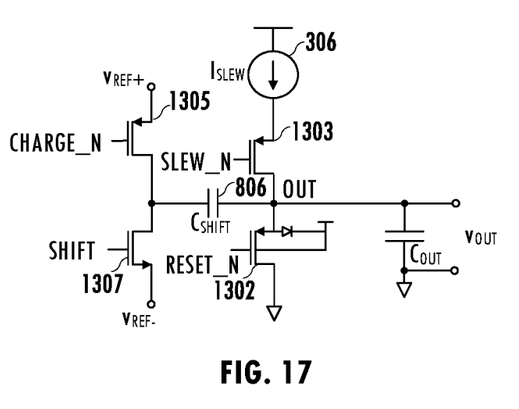
FIG. 17 illustrates a circuit diagram of an exemplary level-shifting time-to-voltage converter consistent with at least one embodiment of the invention.

Referring to FIGS. 9 and 17, in at least one embodiment of a level-shifting time-to-voltage converter a switch described above as being responsive to signal SLEW to control the slewing interval of the level-shifting time-to voltage converter, is implemented using p-type transistor 1303. P-type transistor 1303 is responsive to signal SLEW_N, which is complementary to signal SLEW. A switch described above as being responsive to signal CHARGE to control pre-charging capacitor 806 (e.g., during a reset interval) is implemented using p-type transistor 1305. P-type transistor 1305 is responsive to signal CHARGE_N, which is complementary to signal CHARGE. After the resetting and pre-charging interval, a switch responsive to signal SHIFT causes the level-shifting time-to-voltage converter to shift the output voltage from reset voltage $v_{RESET}$ by shift voltage $\Delta v_{SHIFT}$. The switch responsive to signal SWITCH is implemented using n-type transistor 1307. In other embodiments, additional transistors are included in the implementations of those switches (e.g., implementations of those switches as differential switches responsive to the corresponding control signal and a complement of the corresponding control signal).

Note that complementary circuits implement other embodiments of level-shifting time-to-voltage converter that extend the voltage range above $V_{DD}$ (instead of below ground) that use devices that are complementary to those illustrated in FIGS. 8-15. For example, p-type transistor 1302 of FIG. 13 would be replaced with an n-type transistor sitting in an isolated p-type well (e.g., generated using deep n-well processing steps of a conventional CMOS manufacturing process) and would be coupled to $V_{DD}$. Accordingly, the extended output voltage range of a level-shifting time-to-voltage converter may be $0 \text{ V} < v_{OUT} < 2 \times V_{DD}$ or $0 \text{ V} < v_{OUT} < V_{DD1} + V_{DD2}$.

Thus, embodiments of a level-shifting time-to-voltage converter that extends the output voltage range have been described. The level-shifting time-to-voltage converter increases the voltage available to the current source during a slewing interval of the time-to-voltage conversion, which may improve achievable jitter performance for both random and deterministic jitter. The description of the invention set forth herein is illustrative and is not intended to limit the scope of the invention as set forth in the following claims. For example, while the invention has been described in an embodiment in which capacitive digital-to-analog converters are used in a digital-to-time converter application, one of skill in the art will appreciate that the teachings herein can be utilized in other timing applications. In addition, note that the circuit implementation of capacitive digital-to-analog converter of FIG. 10 is exemplary only. One of skill in the art will appreciate that the teachings herein can be utilized in other capacitive digital-to-analog converters using functionally equivalent circuits and/or complementary devices. Variations and modifications of the embodiments disclosed herein, may be made based on the description set forth herein, without departing from the scope of the invention as set forth in the following claims.

What is claimed is:

1. An apparatus comprising:
   a first voltage reference node;
   a second voltage reference node; and
   a time-to-voltage converter comprising:
      a switched-capacitor circuit configured to charge an output node to a reset voltage level in a first interval of a conversion period and configured to shift a voltage on the output node from the reset voltage level to a shifted reset voltage level in a second interval of the conversion period,
      wherein the shifted reset voltage level is outside a voltage range of the voltage on the output node defined by a first power supply voltage level on the first voltage reference node and a second power supply voltage level on the second voltage reference node.

2. The apparatus, as recited in claim 1, wherein the second voltage reference node is a positive power supply node or a ground node, the shifted reset voltage level is less than the second power supply voltage level if the second voltage reference node is a ground node, and the shifted reset voltage level is greater than the second power supply voltage level if the second voltage reference node is the positive power supply node.

3. The apparatus, as recited in claim 1, wherein the shifted reset voltage level is at least $V_T$ outside the voltage range, $V_T$ being a threshold voltage of a transistor in the switched-capacitor circuit, the transistor being configured to charge the output node in the first interval.

4. The apparatus, as recited in claim 1, further comprising:
   a first transistor having a first conductivity type and being coupled to the output node, the first transistor being configured as a first open switch in the first interval and the second interval, and
   wherein the switched-capacitor circuit comprises a second transistor having the first conductivity type and being coupled between the output node and the second voltage reference node, the second transistor being configured as a second open switch in the second interval and a third interval of the conversion period.

5. The apparatus, as recited in claim 4, wherein the switched-capacitor circuit comprises:
a level shifting circuit configured to provide a level-shifted control signal to a gate terminal of the second transistor, the level-shifted control signal having a level-shifted voltage level outside the voltage range.

6. The apparatus, as recited in claim 5, wherein the switched-capacitor circuit further comprises an additional transistor coupled between the second transistor and the second voltage reference node, the additional transistor having a second gate terminal coupled to a second level-shifted control signal, the second level-shifted control signal being complementary to the level-shifted control signal.

7. The apparatus, as recited in claim 5, wherein the switched-capacitor circuit further comprises:
a capacitor coupled between a first node and the output node;
a first switch coupled between the first node and a third voltage reference node;
a second switch coupled between the first node and a fourth voltage reference node,
wherein the first switch is responsive to a first control signal to close the first switch during the first interval and to open the first switch during the second interval and the third interval,
wherein the second switch is responsive to a second control signal to close the second switch during the second interval and the third interval and to open the second switch during the first interval.

8. The apparatus, as recited in claim 1, further comprising:
a comparator configured to generate an output time signal in response to a comparison of the voltage on the output node and a threshold voltage level of the comparator,
wherein the switched-capacitor circuit comprises a capacitive digital-to-analog converter configured to shift the voltage on the output node from the reset voltage level to the shifted reset voltage level in response to an input digital code during the second interval, and
wherein the time-to-voltage converter and the comparator are configured as a digital-to-time converter and the output time signal corresponds to the input digital code.

9. The apparatus, as recited in claim 1, further comprising:
a current source selectively coupled between the output node and the first voltage reference node, the current source being configured to provide a constant current to the output node in a third interval of the conversion period;
a phase detector configured to generate an input time signal including a pulse indicative of a time between a first transition of an input start signal and a second transition of an input stop signal; and
an analog-to-digital converter configured to generate a digital code corresponding to the voltage on the output node,
wherein the phase detector, the time-to-voltage converter, and the analog-to-digital converter are configured as a time-to-digital converter and the current source is selectively coupled to the output node using the input time signal.

10. A method for converting a time signal to a voltage signal, the method comprising:
storing charge on a capacitor of a time-to-voltage converter to provide a reset voltage level on an output node of the time-to-voltage converter in a first interval of a time-to-voltage conversion; and
shifting a voltage level of the output node from the reset voltage level to a shifted reset voltage level in a second interval of the time-to-voltage conversion,
wherein the shifted reset voltage level is outside a voltage range of an output signal of the time-to-voltage converter defined by a first power supply voltage level on a first voltage reference node and a second power supply voltage level on a second voltage reference node.

11. The method, as recited in claim 10, wherein the second voltage reference node is a positive power supply node or a ground node, the shifted reset voltage level is less than the second power supply voltage level if the second voltage reference node is a ground node, and the shifted reset voltage level is greater than the second power supply voltage level if the second voltage reference node is the positive power supply node.

12. The method, as recited in claim 10, wherein the shifted reset voltage level is at least $V_T$ outside the voltage range, $V_T$ being a threshold voltage of a transistor used by the storing.

13. The method, as recited in claim 10, further comprising:
charging the capacitor to an output voltage level using a constant current during a third interval of the time-to-voltage conversion.

14. The method, as recited in claim 13, wherein the charging comprises:
providing the constant current using a current source selectively coupled to the capacitor, the constant current flowing from the current source to the capacitor,
wherein the shifted reset voltage level is less than the second power supply voltage level.

15. The method, as recited in claim 13, wherein the charging comprises:
providing the constant current using a current source selectively coupled to the capacitor, the constant current flowing from the capacitor to the current source,
wherein the shifted reset voltage level is greater than the first power supply voltage level.

16. The method, as recited in claim 13, further comprising:
generating an input interval in response to a first input signal and a second input signal, the charging being based on the input interval; and
converting the voltage level on the output node into a digital code corresponding to the input interval.

17. The method, as recited in claim 13, further comprising:
converting an input digital code into a shift voltage used in the shifting; and
generating an output time signal in response to a comparison of the output voltage level and a threshold voltage level.

18. The apparatus, as recited in claim 1, wherein the time-to-voltage converter further comprises a current source selectively coupled to the output node, the current source comprising a first transistor having a first conductivity type and being coupled to the output node, and
wherein the switched-capacitor circuit comprises:
a capacitor coupled between a first node and the output node;
a second transistor having the first conductivity type and being coupled to the first node; and
a third transistor having the first conductivity type and being coupled to the output node, the second transistor and the third transistor being configured to charge the output node to the reset voltage level in the first interval of the conversion period and being configured as open circuits in the second interval of the conversion period and in a third interval of the conversion period.

19. The apparatus, as recited in claim 18, wherein the current source and the switched-capacitor circuit are configured to change the voltage on the output node at a constant rate from the shifted reset voltage level in the third interval.

20. The apparatus, as recited in claim 19, wherein the switched-capacitor circuit further comprises:
   a fourth transistor having a second conductivity type, the fourth transistor being coupled to the first node and being configured to shift the voltage on the output node from the reset voltage level to the shifted reset voltage level in the second interval and configured as an open switch in the first interval.

* * * * *